US012696441B2

(12) United States Patent
Jen et al.

(10) Patent No.: US 12,696,441 B2
(45) Date of Patent: Jul. 28, 2026

(54) SEMICONDUCTOR STRUCTURE

(71) Applicant: Winbond Electronics Corp., Taichung City (TW)

(72) Inventors: Kai Jen, Taichung City (TW); Hsiang-Po Liu, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 136 days.

(21) Appl. No.: 18/671,641

(22) Filed: May 22, 2024

(65) Prior Publication Data

US 2024/0312791 A1    Sep. 19, 2024

Related U.S. Application Data

(62) Division of application No. 17/365,203, filed on Jul. 1, 2021, now Pat. No. 12,020,945.

(30) Foreign Application Priority Data

Jul. 3, 2020    (TW) ................................. 109122653

(51) Int. Cl.
| | |
|---|---|
| *H10D 64/20* | (2025.01) |
| *H10B 12/00* | (2023.01) |
| *H10P 14/61* | (2026.01) |
| *H10P 50/00* | (2026.01) |

(52) U.S. Cl.
CPC .......... *H10B 12/482* (2023.02); *H10B 12/01* (2023.02); *H10D 64/20* (2025.01); *H10P 14/61* (2026.01); *H10P 50/73* (2026.01)

(58) Field of Classification Search
CPC . H10B 12/482; H10B 12/01; H01L 21/31116; H01L 21/31144; H10D 64/20
See application file for complete search history.

(56) References Cited

U.S. PATENT DOCUMENTS

| | | | |
|---|---|---|---|
| 9,972,702 B2 | 5/2018 | Chen et al. | |
| 10,529,570 B1 | 1/2020 | Shih | |
| 2013/0277823 A1* | 10/2013 | Ogisu | H01L 21/32139 |
| | | | 257/734 |
| 2014/0319700 A1* | 10/2014 | Koshiba | H01L 21/32139 |
| | | | 438/694 |
| 2017/0178907 A1* | 6/2017 | Sim | H01L 21/0335 |
| 2017/0243818 A1* | 8/2017 | Aburada | H01L 23/528 |

FOREIGN PATENT DOCUMENTS

| | | |
|---|---|---|
| CN | 103779263 A | 5/2014 |
| TW | I-278100 B | 4/2007 |

* cited by examiner

*Primary Examiner* — Ratisha Mehta
*Assistant Examiner* — Brad A Knudson
(74) *Attorney, Agent, or Firm* — MUNCY, GEISSLER, OLDS & LOWE, P.C.

(57) ABSTRACT

A semiconductor structure includes a substrate, an insulating layer formed on the substrate, and a plurality of pairs of linear structures arranged in parallel and formed in the insulating layer, wherein each pair of linear structures has a first linear structure and a second linear structure. There is a first space S1 between an end portion of the first linear structure and an end portion of the second linear structure, there is a second space S2 between a center portion of the first linear structure and a center portion of the second linear structure, and the second space S2 is greater than the first space S1.

16 Claims, 11 Drawing Sheets

I                                                      I'

II                                                      II'

I                                          I'

II                                          II'

I     I'

114 — 118 — 112 — 104 — 102

II     II'

116 — 114 — 118 — 112 — 104 — 102

I    I'
II    II'
118

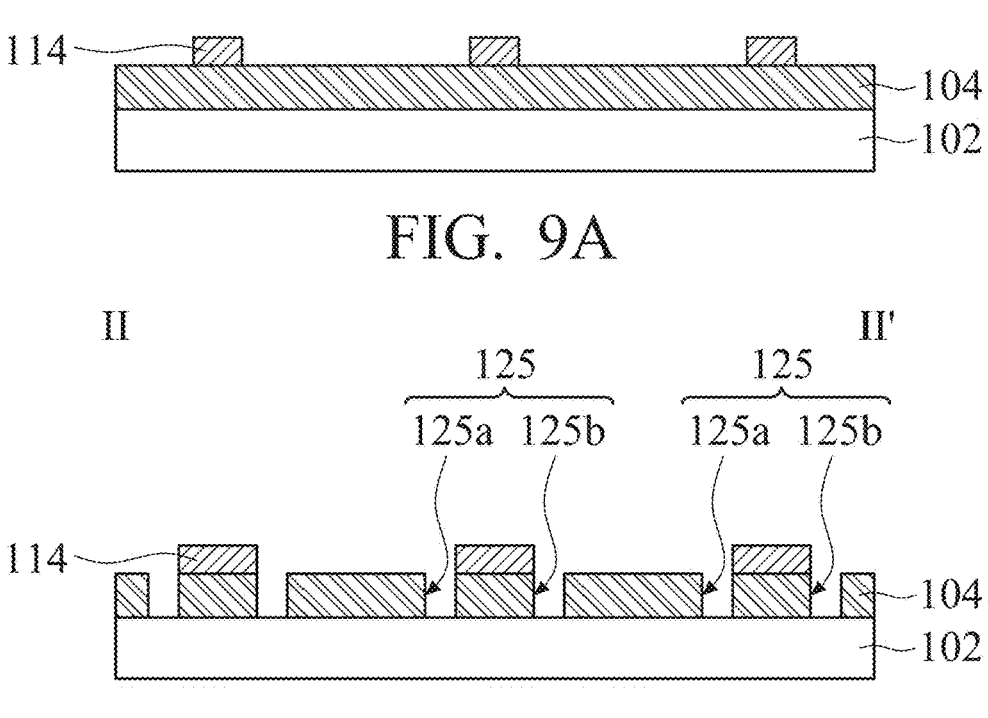
FIG. 9A
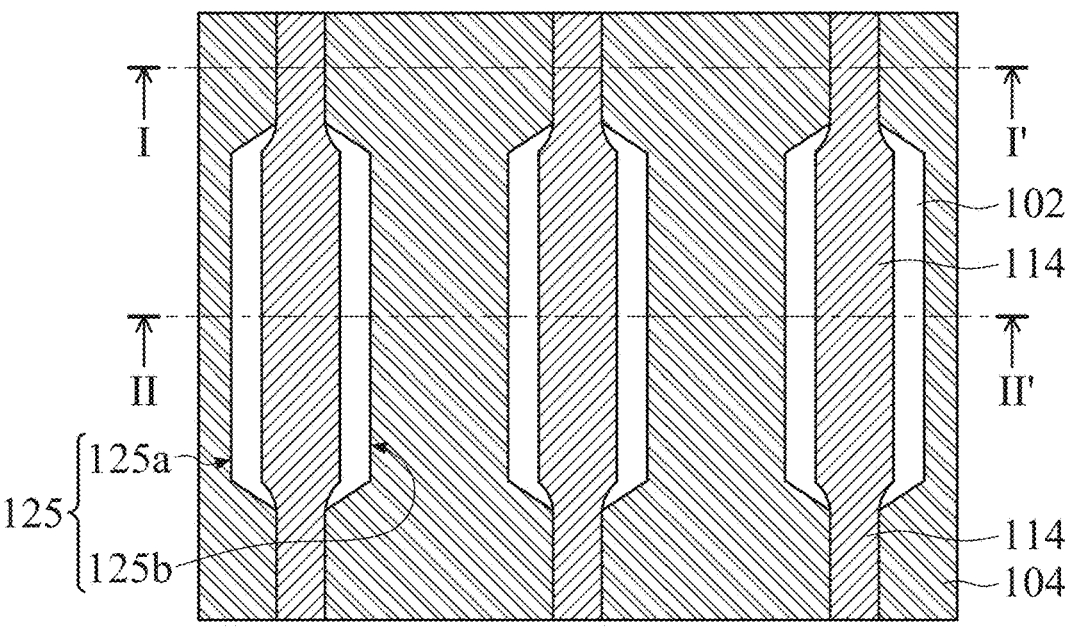
FIG. 9B
FIG. 9C

I                                                                                  I'

100

104
102

II                                                                                 II'

100

130    130          130    130          130    130

104
102

100

SEMICONDUCTOR STRUCTURE

CROSS REFERENCE TO RELATED APPLICATIONS

This application is a Divisional of pending U.S. patent application Ser. No. 17/365,203, filed Jul. 1, 2021 and entitled "DYNAMIC RANDOM ACCESS MEMORY AND METHOD FOR MANUFACTURING THE SAME", which claims priority of Taiwan Patent Application No. 109122653, filed on Jul. 3, 2020, the entirety of which is incorporated by reference herein.

BACKGROUND OF THE INVENTION

Field of the Invention

The present invention relates to a semiconductor structure.

Description of the Related Art

With the increasing demand for miniaturization, how to increase the density of semiconductor elements has become an important issue. In the manufacturing process of semiconductor devices, in order to increase the density of semiconductor elements, a spacer patterning process and a self-aligned double patterning (SADP) process may be used to reduce the critical dimensions of the semiconductor elements.

In a conventional SADP process, the following steps are usually included: a plurality of first patterns composed of a mandrel is formed by using a first photomask; a spacer material is conformally formed to cover the mandrel; the mandrel and the spacer material on the top of the mandrel are removed to leave a plurality of second patterns composed of the spacer material; the plurality of second patterns are used as a mask to etch the underlying layers; and by using a second photomask, an end cut step is performed to cut the plurality of ring-shaped second patterns into a plurality of parallel lines.

However, in a conventional SADP process, at least two photomasks are required, resulting in a higher production cost. Furthermore, if the alignment between the second mask and the second patterns is shifted, one end of the second pattern of the ring-shaped may not be cut off. As a result, a predetermined number of parallel lines cannot be formed, which reduces the yield and reliability of the product. In addition, in order to align the second photomask with the second patterns well, the complexity of the manufacturing process is generally increased.

Therefore, in this technical field, there is still a need for a semiconductor structure with high yield and high reliability and manufacturing methods thereof.

BRIEF SUMMARY OF THE INVENTION

In accordance with some embodiments of the present disclosure, a semiconductor structure is provided. The semiconductor structure includes a substrate, an insulating layer formed on the substrate, and a plurality of pairs of linear structures arranged in parallel and formed in the insulating layer, wherein each pair of linear structures has a first linear structure and a second linear structure. There is a first space S1 between an end portion of the first linear structure and an end portion of the second linear structure, there is a second space S2 between a center portion of the first linear structure and a center portion of the second linear structure and a center portion of the second linear structure, and the second space S2 is greater than the first space S1.

BRIEF DESCRIPTION OF THE DRAWINGS

The present invention can be more fully understood by reading the subsequent detailed description and examples with references made to the accompanying drawings, wherein:

FIG. 1A-10A and FIG. 1B-10B are cross-sectional views corresponding to various steps of manufacturing a semiconductor structure in accordance with some embodiments of the present invention.

FIG. 1C-10C are top-views corresponding to various steps of manufacturing a semiconductor structure in accordance with some embodiments of the present invention.

DETAILED DESCRIPTION OF THE INVENTION

Figures 10A, 10B, 10C:
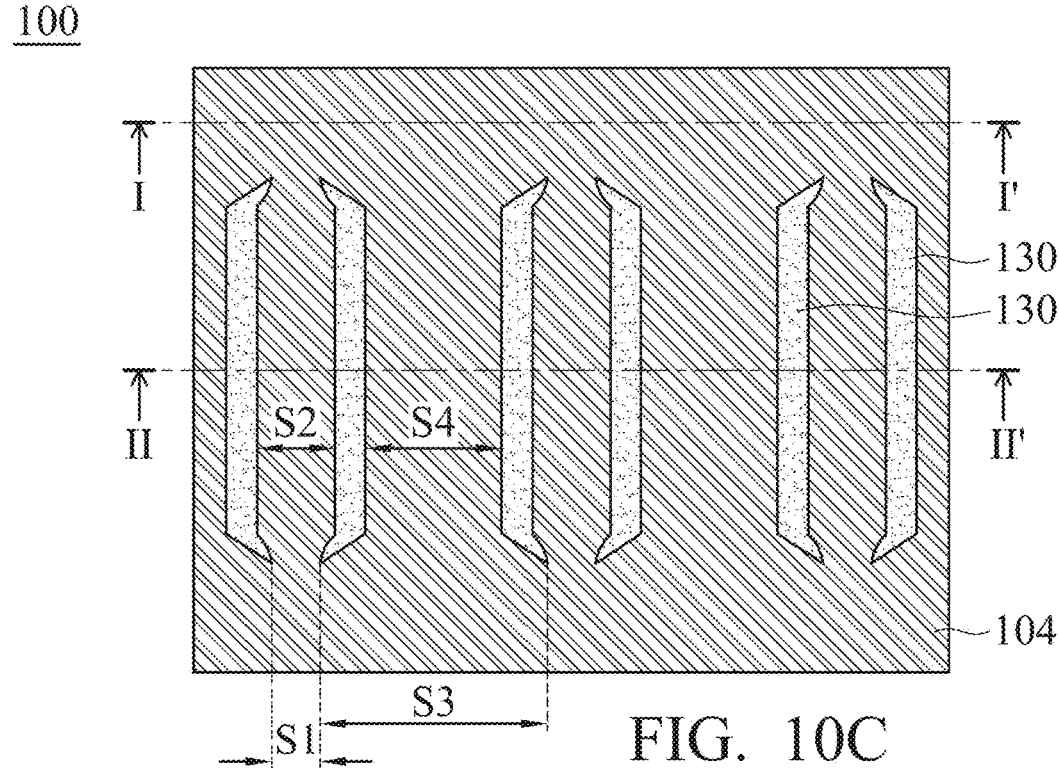

A method for manufacturing a semiconductor structure is provided in the embodiments of the present invention. FIG. 1C-10C are top-views corresponding to various steps of manufacturing a semiconductor structure. FIG. 1A-FIG. 10A are cross-sectional views taken along line I-I' of FIG. 1 (not shown). FIG. 1B,-10B are cross-sectional views taken along line II-II' of FIG. 1 (not shown).

Figure 1A:
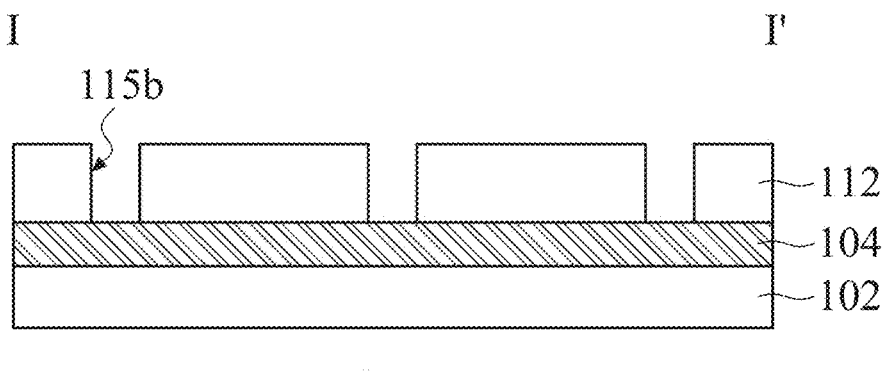
Figure 1B:
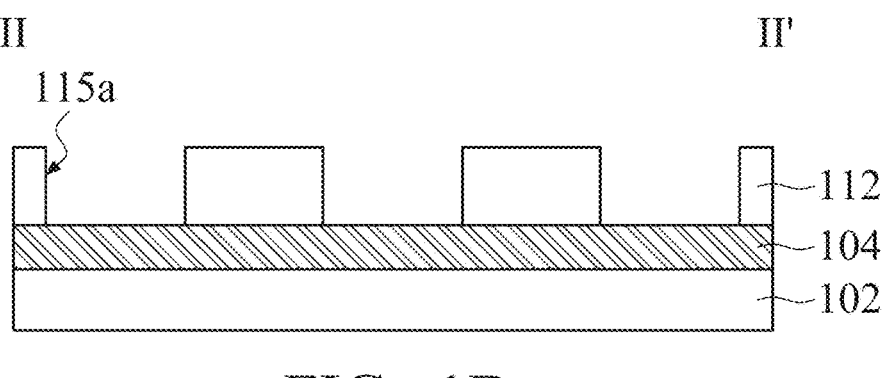
Figure 1C:
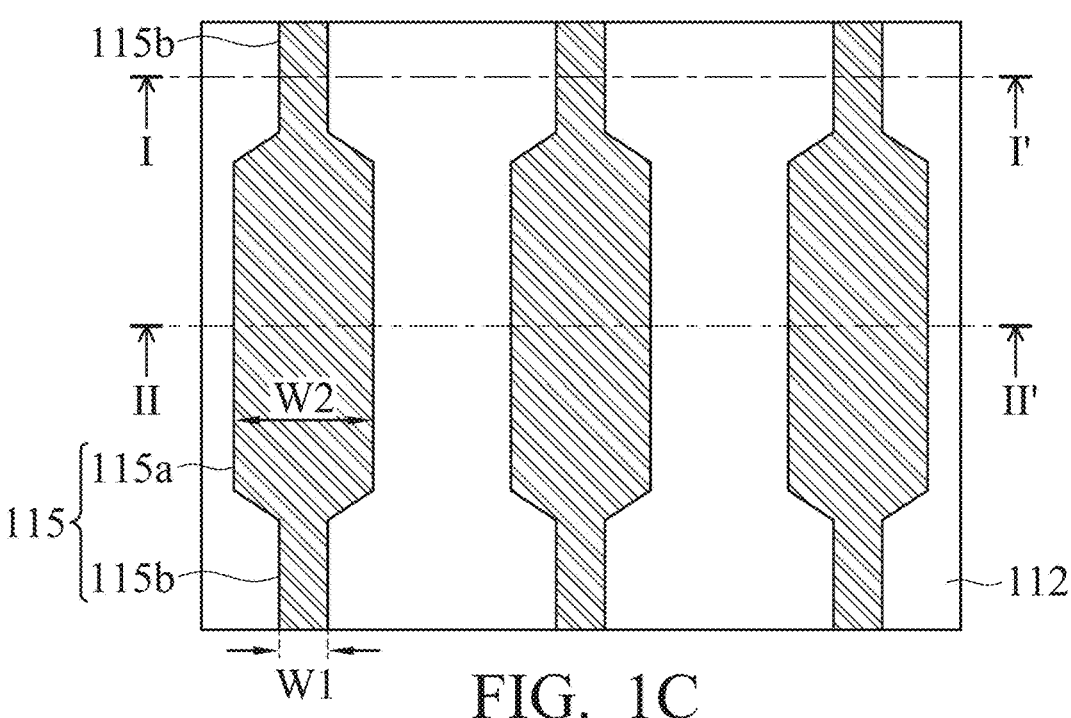

Referring to FIG. 1A-1C, an insulating layer 104 is formed on the substrate 102, and the patterned mask layer 112 is formed on the insulating layer 104. The patterned mask layer 112 has a plurality of openings 115. Each of the openings 115 includes one main body portion 115a and two extension portions 115b respectively located at both ends of the main body portion 115a. In FIG. 1C, the shape of the main body portion 115a has a shape being approximately rectangular or hexagonal, and the two extension portions 115b respectively extend outward along the long axis direction of the main body portion 115a. The extension portion 115b has a shape being approximately rectangular, and the long axis direction of the extension portion 115b is the same as the long axis direction of the main body portion 115a. In the short axis direction of the main body portion 115a, the width of the main body portion 115a is larger than the width of the extension portion 115b.

The material of the substrate 102 may include silicon, gallium arsenide, gallium nitride, germanium silicide, silicon on insulator (SOI), or a combination thereof. In the present embodiment, the substrate 102 is a silicon substrate, other structures may also be formed in the substrate 102, for example, isolation structures, p-type implant regions, or n-type implant regions (not shown). The material of the insulating layer 104 may include polycrystalline silicon, oxide, nitride, oxynitride, carbon-based material (for example, diamond-like carbon film), other suitable insulating materials, or a combination thereof. In the present embodiment, the material of the insulating layer 104 is silicon nitride.

The patterned mask layer 112 may be formed by a conventional method. For example, a mask layer is formed on the insulating layer 104, and then, a patterning process is performed to form the patterned mask layer 112 by using a photomask (not shown). In the present embodiment, the material of the patterned mask layer 112 is polycrystalline silicon, the insulating layer 104 and the patterned mask layer 112 are made of different materials.

Figure 2A:
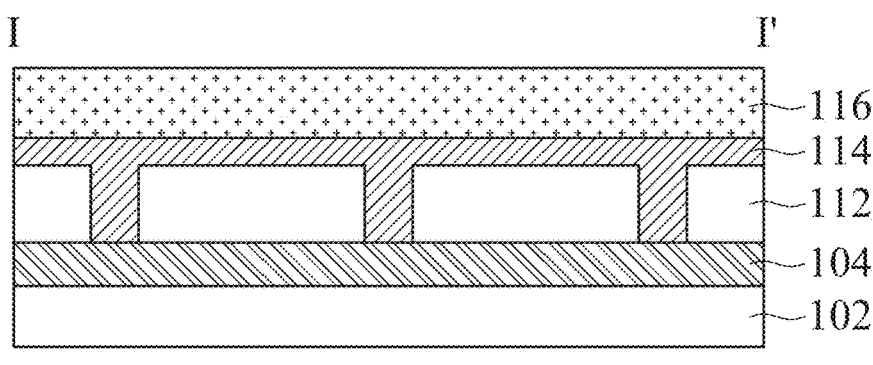
Figure 2B:
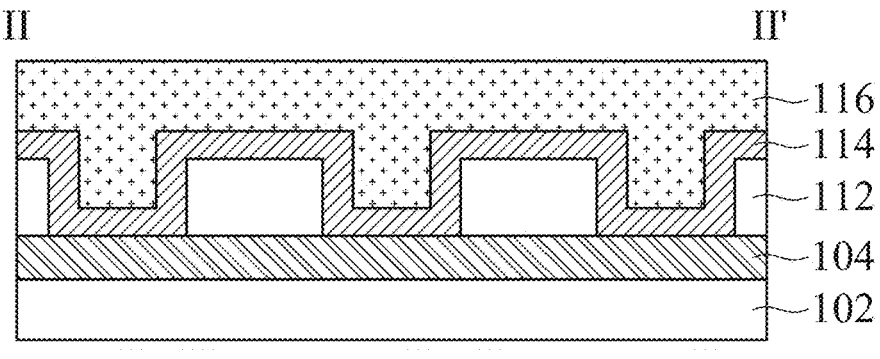
Figure 2C:
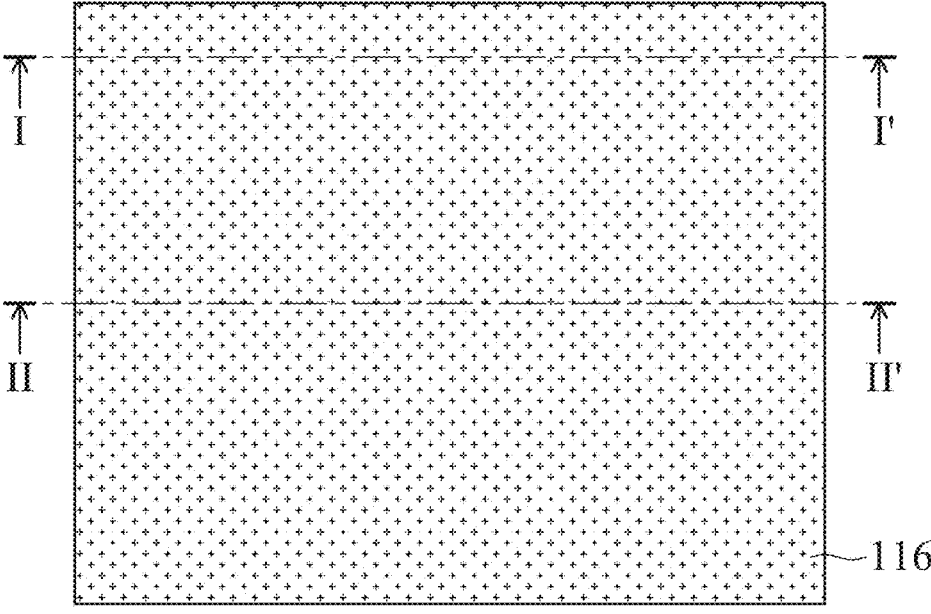

Referring to FIG. 2A-2C, a first sacrificial layer 114 is conformally formed on the insulating layer 104 and the patterned mask layer 112, and the first sacrificial layer 114 fills the openings 115. The width of the main body portion 115$a$ is greater than the width of the extension portions 115$b$. Therefore, before the first sacrificial layer 114 completely fills the main body portion 115$a$ of the opening 115, the first sacrificial layer 114 has completely filled the extension portions 115$b$ of the opening 115. Next, a second sacrificial layer 116 is formed on the first sacrificial layer 114 so that the second sacrificial layer 116 completely fills the recess defined by first sacrificial layer 114 in the main body portion 115$a$.

The material of the first sacrificial layer 114 may include polycrystalline silicon, oxide, nitride, oxynitride, or a combination thereof. In the present embodiment, the material of the first sacrificial layer 114 is silicon oxide, the material of the second sacrificial layer 116 is polycrystalline silicon.

Figure 3A:
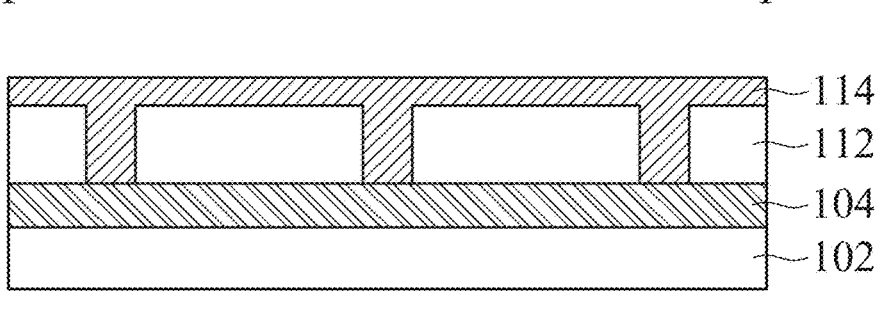
Figure 3B:
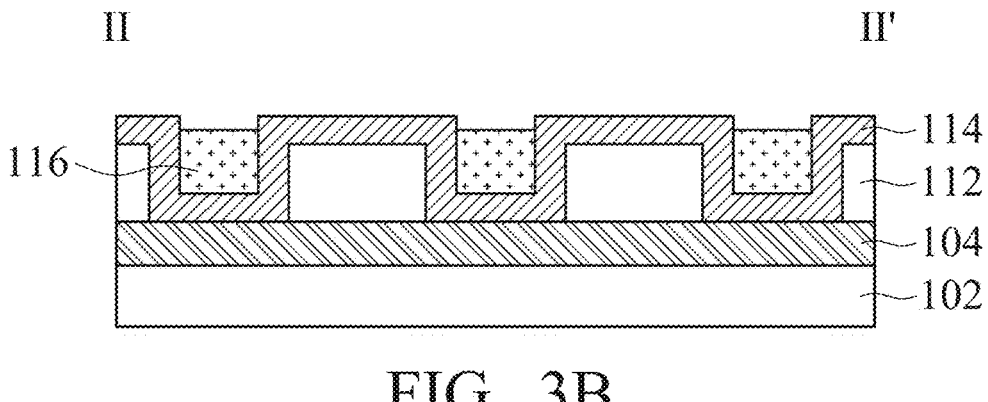
Figure 3C:
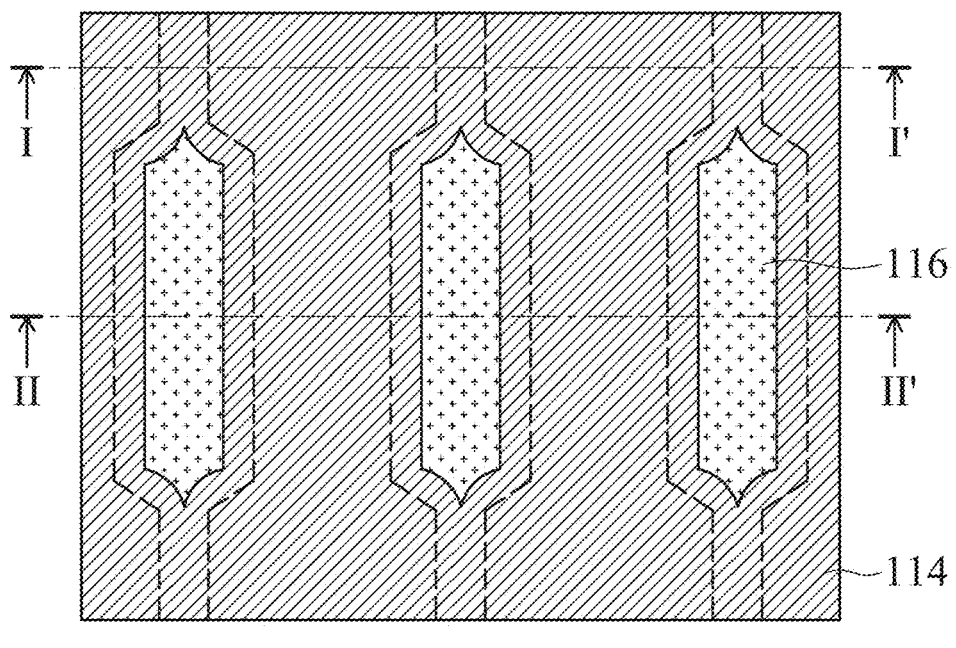

Referring to FIG. 3A-3C, a first etch-back process is performed on the second sacrificial layer 116 to remove the second sacrificial layer 116 located in the extension portions 115$b$ and leave a portion of the second sacrificial layer 116 located in the main body portion 115$a$. After the first etch-back process, a portion of the first sacrificial layer 114 located in the main body portion 115$a$ is covered by the second sacrificial layer 116, and the first sacrificial layer 114 located in the extension portions 115$b$ is not covered by the second sacrificial layer 116.

In the present embodiment, the first etch-back process is a dry etching process. Furthermore, in order to selectively remove the second sacrificial layer 116 and retain the first sacrificial layer 114, the etching selectivity of the first etch-back process may be increased. The first sacrificial layer 114 and the second sacrificial layer 116 are made of different materials, during the first etch-back process, the ratio R2$a$/R1$a$ of the etching rate R2$a$ of the second sacrificial layer 116 to the etching rate R1$a$ of the first sacrificial layer 114 is 5-20.

Figure 4A:
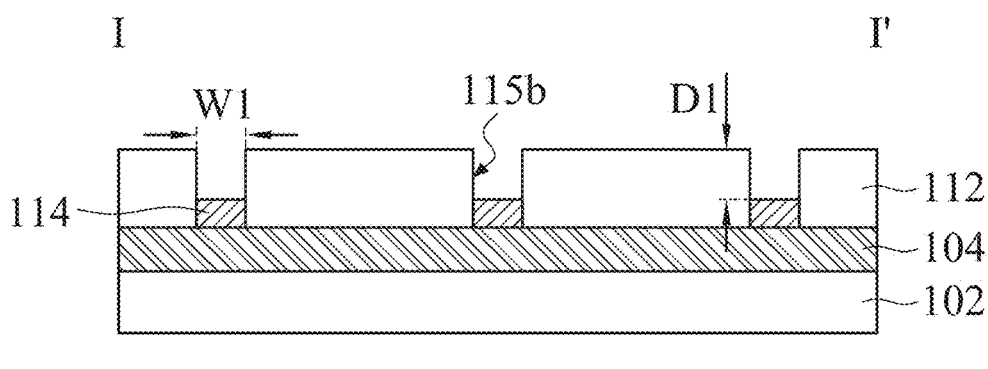
Figure 4B:
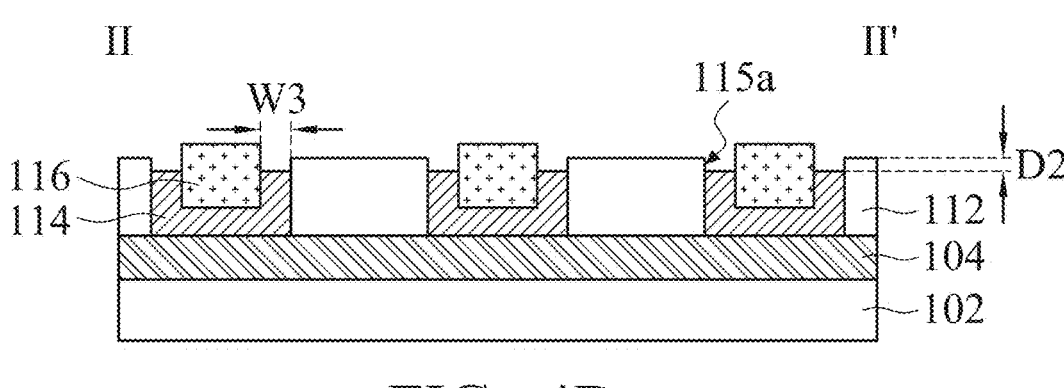
Figure 4C:
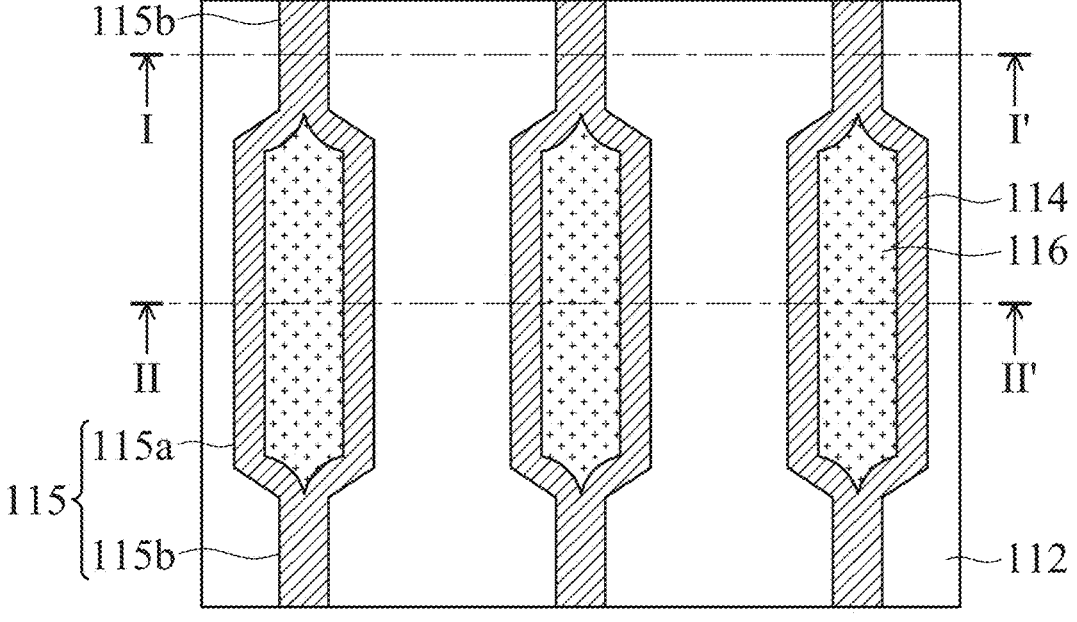

Referring to FIG. 4A-4C, after the first etch-back process, a second etch-back process is performed on the first sacrificial layer 114 to remove a portion of the first sacrificial layer 114. The second etch-back process is a dry etching process. Furthermore, in order to selectively remove the first sacrificial layer 114 and retain the patterned mask layer 112 and the second sacrificial layer 116, the etching selectivity of the second etch-back process may be increased. The first sacrificial layer 114 and the patterned mask layer 112 are made of different materials. During the second etch-back process, the ratio R2$b$/R1$b$ of the etching rate R2$b$ of the first sacrificial layer 114 to the etching rate R1$b$ of the patterned mask layer 112 is 5-20, and the ratio R2$b$/R3$b$ of the etching rate R2$b$ of the first sacrificial layer 114 to the etching rate R3$b$ of the second sacrificial layer 116 is 5-20.

After the second etch-back process, in the extension portions 115$b$, there is a first distance D1 between the top surface of the first sacrificial layer 114 and the top surface of the patterned mask layer 112. After the second etch-back process, in the main body portion 115$a$, there is a second distance D2 between the top surface of the first sacrificial layer 114 and the top surface of the patterned mask layer 112. The first distance D1 is greater than the second distance D2 due to the influence of the loading effect, and the details will be discussed in the following paragraphs.

Figure 5A:
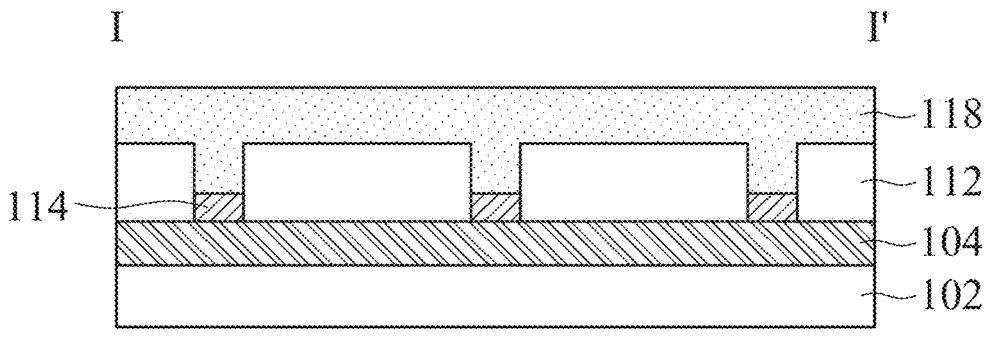
Figure 5B:
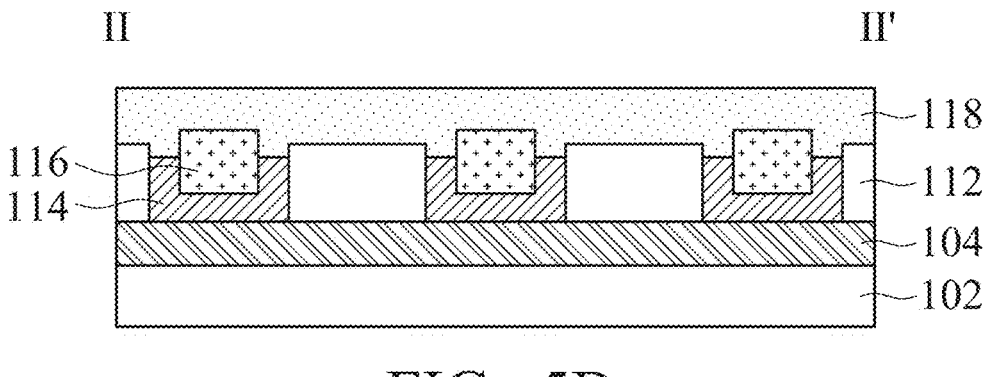
Figure 5C:
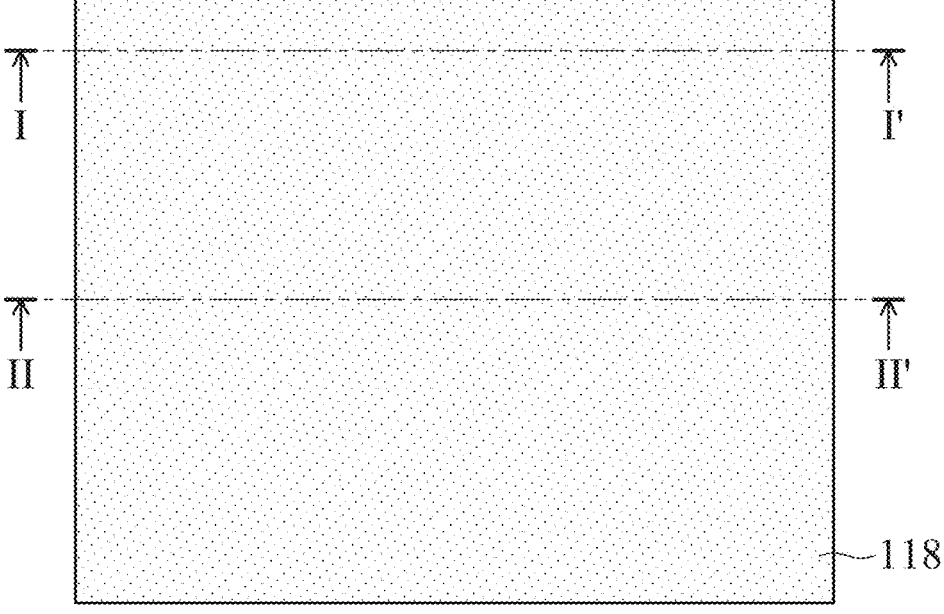

Referring to FIG. 5A-5C, after the second etch-back process, a third sacrificial layer 118 is formed on the patterned mask layer 112, the first sacrificial layer 114, and the second sacrificial layer 116. In the present embodiment, the material of the third sacrificial layer 118 is silicon nitride.

Figure 6A:
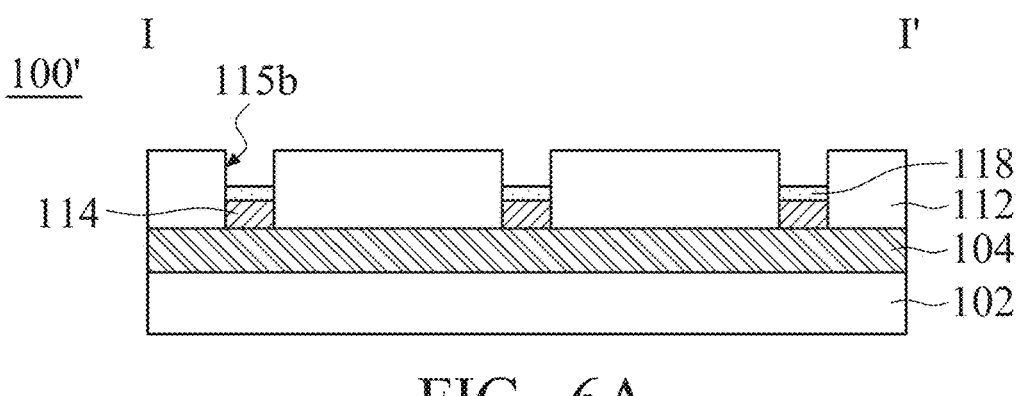
Figure 6B:
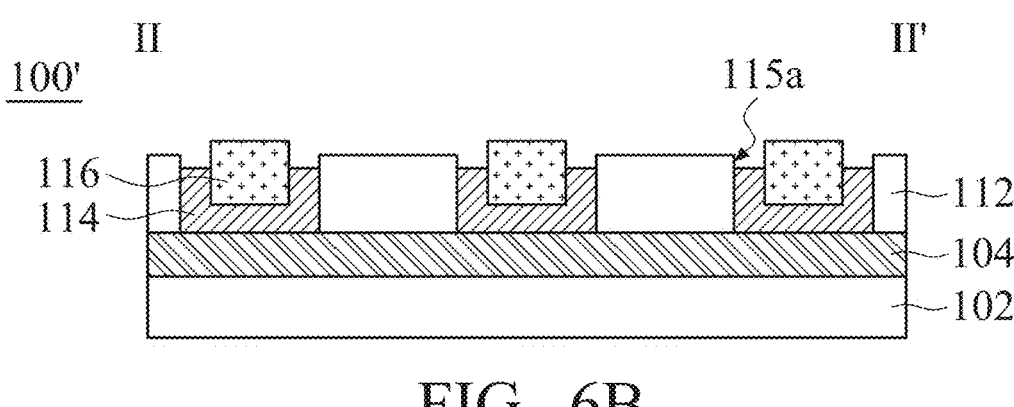
Figure 6C:
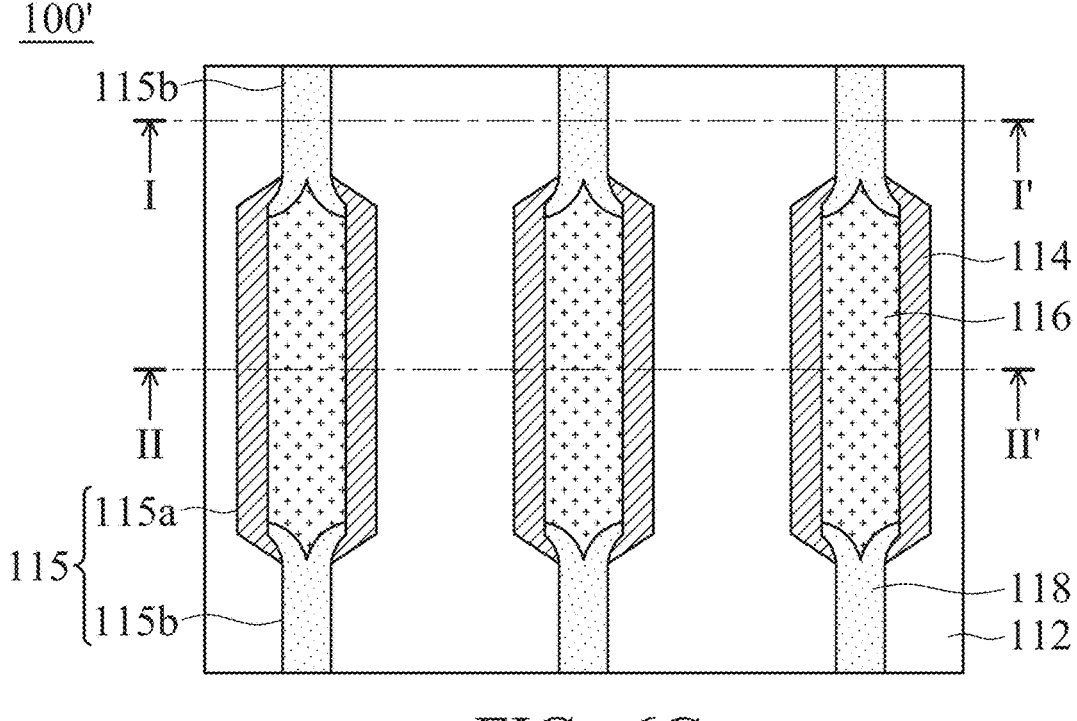

Referring to FIG. 6A-6C, a third etch-back process is performed on the third sacrificial layer 118 to remove a portion of the third sacrificial layer 118 located in the main body portion 115$a$ and retain the third sacrificial layer 118 located in the extension portions 115$b$. After the third etch-back process, the second sacrificial layer 116 located in the main body portion 115$a$ is exposed, and the top surface of the third sacrificial layer 118 is lower than the top surface of the patterned mask layer 112.

The third etch-back process is a wet etching process. Furthermore, in order to selectively remove the third sacrificial layer 118 and retain the first sacrificial layer 114 and the second sacrificial layer 116, the etching selectivity of the third etch-back process may be increased. The first sacrificial layer 114 and the third sacrificial layer 118 are made of different materials, and the second sacrificial layer 116 and the third sacrificial layer 118 are made of different materials. In some embodiments, during the third etch-back process, the ratio R3$c$/R1$c$ of the etching rate R3$c$ of the third sacrificial layer 118 to the etching rate R1$c$ of the first sacrificial layer 114 is 5-20.

Since the first distance D1 is greater than the second distance D2, the thickness of the third sacrificial layer 118 located in the extension portion 115$b$ is greater than the thickness of the third sacrificial layer 118 located in the main body portion 115$a$. After the third etch-back process, the first sacrificial layer 114 located in the extension portions 115$b$ is covered by the third sacrificial layer 118, and a portion of the first sacrificial layer 114 located in the main body portion 115$a$ is not covered by the third sacrificial layer 118, as shown in FIG. 6A and FIG. 6B. More specifically, referring to FIG. 6C, since the thickness of the third sacrificial layer 118 gradually decreases from the extension portions 115$b$ to the main body portion 115$a$, the third sacrificial layer 118 also extends from the extension portions 115$b$ to the main body portion 115$a$. After the third etch-back process, the third sacrificial layer 118 forms the pattern as shown in FIG. 6C.

Figure 7A:
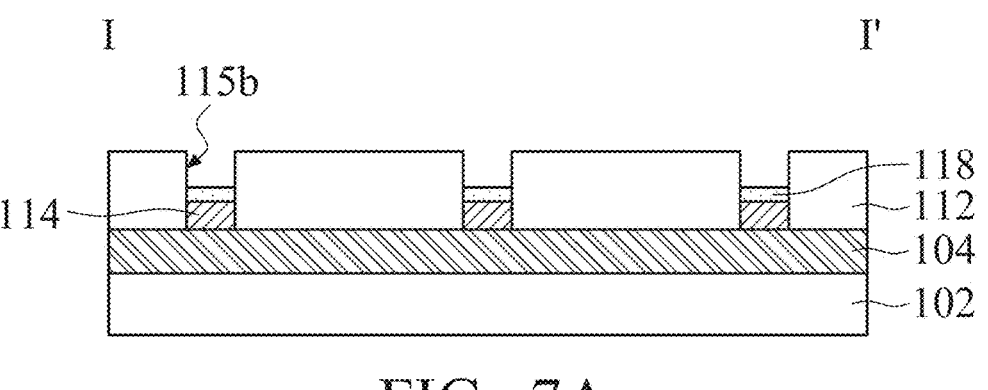
Figure 7B:
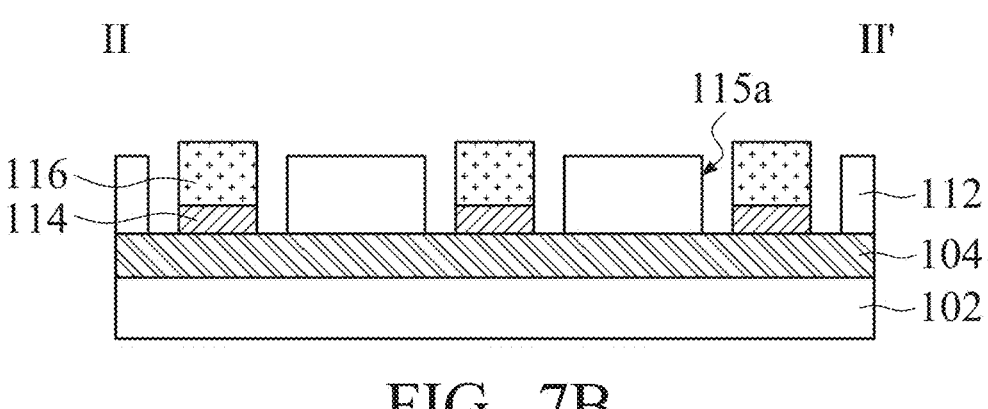
Figure 7C:
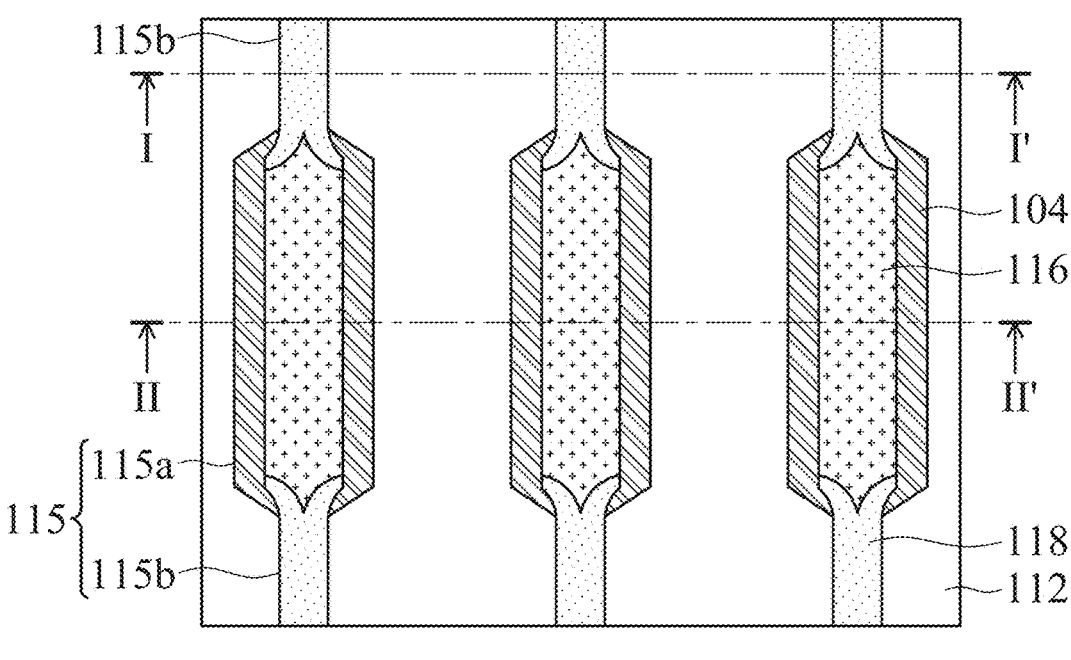

Referring to FIG. 7A-7C, by using the third sacrificial layer 118 and the second sacrificial layer 116 as a mask, a first etching process is performed to remove the portion of the first sacrificial layer 114 that is located in the main body portion 115$a$ and is not covered by the second sacrificial layer 116. In other words, the patterns of the third sacrificial layer 118 and the second sacrificial layer 116 are transferred to the first sacrificial layer 114. After the first etching process, a portion of the insulating layer 104 located in the main body portion 115$a$ is exposed, as shown in FIG. 7C.

The first etching process is a dry etching process. Furthermore, in order to selectively remove the first sacrificial layer 114 and retain the patterned mask layer 112, the second sacrificial layer 116, and the third sacrificial layer 118, the etching selectivity of the first etching process may be increased. During the first etching process, the ratio R2$d$/R1$d$ of the etching rate R2$d$ of the first sacrificial layer 114 to the etching rate R1$d$ of the patterned mask layer 112 is 5-20; the ratio R2$d$/R3$d$ of the etching rate R2$d$ of the first sacrificial layer 114 to the etching rate R3$d$ of the second sacrificial layer 116 is 5-20; and the ratio R2$d$/R4$d$ of the etching rate R2$d$ of the first sacrificial layer 114 to the etching rate R4$d$ of the third sacrificial layer 118 is 5-20.

Figure 8A:
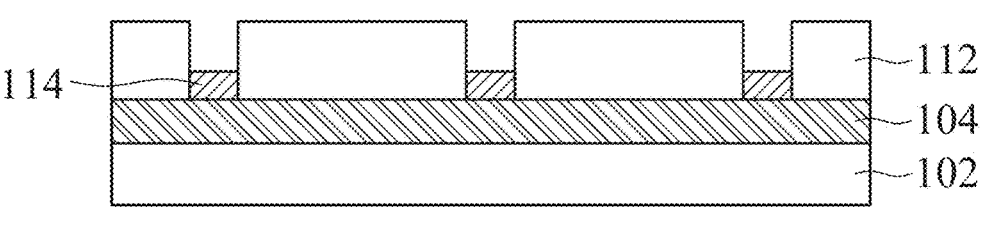
Figure 8B:
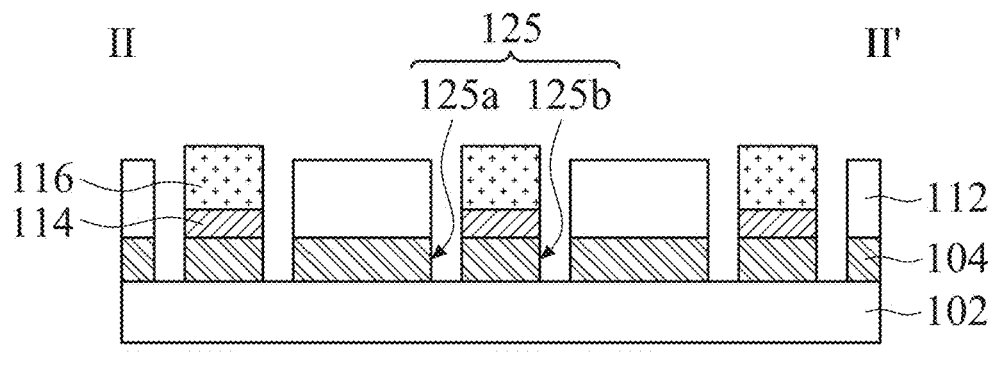
Figure 8C:
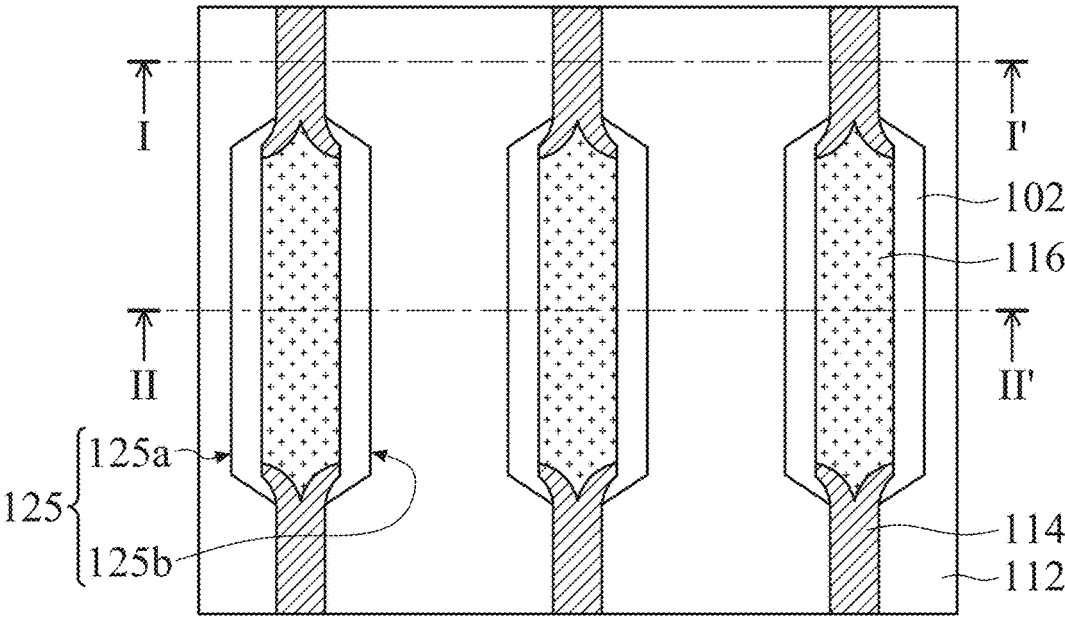

Referring to FIG. 8A-8C, by using the first sacrificial layer 114 as a mask, a second etching process is performed to remove the third sacrificial layer 118 located in the extension portions 115b and remove the portion of the insulating layer 104 that is located in the main body portion 115a and is not covered by the second sacrificial layer 116. After the second etching process, a portion of the substrate 102 located in the main body portion 115a is exposed, and the first sacrificial layer 114 located in the extension portions 115b is exposed. In other words, after the second etching process, a first trench 125a and a second trench 125b are formed on respective sides of the insulating layer 104 that is located in the main body portion 115a, as shown in FIG. 8C.

The second etching process is a dry etching process. Furthermore, in order to selectively remove the insulating layer 104 and the third sacrificial layer 118 and retain the patterned mask layer 112, the first sacrificial layer 114, and the second sacrificial layer 116, the etching selectivity of the second etching process may be increased. The material of the insulating layer 104 is different from the material of the second sacrificial layer 116 and the material of the patterned mask layer 112. The material of the third sacrificial layer 118 is different from the material of the second sacrificial layer 116 and the material of the patterned mask layer 112. For example, during the second etching process, the etching rate of the insulating layer 104 may be the same as or similar to the etching rate of the third sacrificial layer 118, and the etching rate of the insulating layer 104 may be greater than any one of the etching rate of the patterned mask layer 112, the etching rate of the first sacrificial layer 114, and the etching rate of the second sacrificial layer 116.

Referring to FIG. 9A-9C, a third etching process is performed to selectively remove the second sacrificial layer 116 and the patterned mask layer 112. The third etching process is a dry etching process. Furthermore, in order to maintain the shapes of the first trench 125a and the second trench 125b, during the third etching process, the etching rate of the second sacrificial layer 116 may be the same as or similar to the etching rate of the patterned mask layer 112, and the etching rate of the second sacrificial layer 116 and the etching rate of the patterned mask layer 112 are much greater than the etching rate of the insulating layer 104.

Referring to FIG. 10A-10C, a fourth etching process is performed to selectively remove the first sacrificial layer 114. The fourth etching process is a dry etching process. Furthermore, in order to maintain the shapes of the first trench 125a and the second trench 125b, during the fourth etching process, the etching rate of the first sacrificial layer 114 is much greater than the etching rate of the insulating layer 104.

Next, a filling material fills the first trench 125a and the second trench 125b, and a planarization process (for example, a chemical mechanical polishing process) is optionally performed to form linear structures 130. In some embodiments, the filling material is a conductive material (for example, a metal, an alloy, or a combination thereof), and the linear structure 130 is a conductive line. In other embodiments, the filling material is an insulating material (for example, oxide, nitride, or oxynitride), and the linear structures 130 is an isolation structure. Afterward, other conventional processes may be performed to complete the semiconductor structure 100.

In the manufacturing method of the semiconductor structure 100 provided in the present embodiment, by forming an opening which has a specific shape and controlling the loading effect during etching of the sacrificial layer, the self-aligned double patterning process can be simplified.

More specifically, referring to FIG. 1C, the opening 115 includes the main body portion 115a and the extension portions 115b. The extension portion 115b has a first width W1, the main body portion 115a has a second width W2, and the second width W2 is greater than the first width W1. Therefore, as shown in FIG. 3C, when the first sacrificial layer 114 has completely filled the extension portions 115b, the main body portion 115a has not been completely filled by the first sacrificial layer 114. As a result, a recess having a smaller area is left in the main body portion 115a (that is, the region that will be filled by the second sacrificial layer 116). In other words, the first sacrificial layer 114 is formed around the main body portion 115a and surrounds the above-mentioned recess.

Referring to FIG. 4A-4B, then, the first sacrificial layer 114 located in the extension portions 115b has a first width W1, the first sacrificial layer 114 located in the main body portion 115a has a third width W3, and the first width W1 is greater than the third width W3. When the second etch-back process is performed, the etching rate of the first sacrificial layer 114 located in the extension portions 115b is greater than the etching rate of the first sacrificial layer 114 located in the main body portion 115a due to the influence of the loading effect. Therefore, the etching depth (i.e., the first distance D1) of the first sacrificial layer 114 located in the extension portions 115b is greater than the etching depth (i.e., the second distance D2) of the first sacrificial layer 114 located in the main body portion 115a.

In addition, since the third sacrificial layer 118 will form the pattern as shown in FIG. 6C, even if the end cut step is not performed, a plurality of substantially parallel and linear trenches 125 (i.e., the first trench 125a and the second trench 125b) can be formed in the insulating layer 114.

The ratio W2/W1 of the second width W2 to the first width W1 may be adjusted to a specific range. As a result, it is advantageous to ensure that the recesses which will be filled by the second sacrificial layer 116 are formed in the first sacrificial layer 114 located in the main body portion 115a (as shown in FIG. 2B). Furthermore, it is advantageous to make the trench 125 has an appropriate width for the subsequent filling step of the filling material and the miniaturization of the device. In some embodiments, the ratio W2/W1 of the second width W2 to the first width W1 is 1.5-4.0.

If the ratio W1/W3 of the first width W1 to the third width W3 is larger, the influence of the loading effect can be increased. In other words, the difference between the etching rate of the first sacrificial layer 114 located in the extension portions 115b and the etching rate of the first sacrificial layer 114 located in the main body portion 115a is increased. The ratio W1/W3 of the first width W1 to the third width W3 may be adjusted to a specific range. In some embodiments, the ratio W1/W3 of the first width W1 to the third width W3 is 1.2-2.0.

The ratio D1/D2 of the first distance D1 to the second distance D2 may be adjusted to a specific range. It is advantageous to avoid removing all of the third sacrificial layer 118 during the third etch-back process, and to ensure that the thickness of the first sacrificial layer 114 is sufficient to protect the insulating layer 104 located in the extension portions 115b during the second etching process. Therefore, the first trench 125a and the second trench 125b can be separated from each other. Referring to FIG. 4A and FIG. 4B, the ratio D1/D2 of the first distance D1 to the second distance D2 is 1.1-4.0. In other embodiments, the ratio D1/D2 of the first distance D1 to the second distance D2 is 2.0-3.0. As a result, the first trench 125a and the second trench 125b will not communicate with each other, and an additional end cut step can be omitted.

Referring to FIG. 6A-6C. The transfer structure 100' includes an insulating layer 104, a patterned mask layer 112, a first sacrificial layer 114, a second sacrificial layer 116, and a third sacrificial layer 118 which are formed on the substrate 102. The patterned mask layer 112 has a plurality of openings 115. Each of the opening 115 includes one main body portion 115a and two extension portions 115b. Each one of the two extension portions 115 is located at one end of the main body portion 115a. The first sacrificial layer 114 is formed the insulating layer 104. The first sacrificial layer 114 forms a recess in the main body portion 115a. The maximum height of the first sacrificial layer 114 located in the main body portion 115a is greater than the maximum height of the first sacrificial layer 114 located in the extension portions 115b. The second sacrificial layer 116 is formed in the recess defined by the first sacrificial layer 114. The third sacrificial layer 118 is formed on the first sacrificial layer 114 located in the extension portions 115b, and a portion of the first sacrificial layer 114 located in the main body portion 115a is not covered by the third sacrificial layer 118. The first sacrificial layer 114 and the second sacrificial layer 116 are made of different materials. The second sacrificial layer 116 and the third sacrificial layer 118 are made of different materials. Other detailed descriptions or manufacturing methods of the transfer structure 100' of the present embodiment have been described in the previous embodiments, and those will not be repeated.

With the transfer structure 100' of the present embodiment, the pattern of the second sacrificial layer 116 can be transferred to the insulating layer 104 in the subsequent first etching process and the second etching process to form the first trench 125a and the second trench 125b shown in FIG. 8C. As a result, a plurality of trenches 125 arranged parallel to each other can be formed without an additional end cut step. Therefore, the production cost and the complexity of the manufacturing process can be significantly reduced.

Referring to FIG. 10C, the semiconductor structure 100 is a bit line or other conductive line of the dynamic random access memory. In one embodiment, the semiconductor structure 100 is an isolation structure of the dynamic random access memory. However, the present invention is not limited to the disclosed embodiments. The semiconductor structure 100 includes a plurality of trenches 125 (marked in FIG. 9C) formed in the insulating layer 104. The trench 125 has a third width W3 (marked in FIG. 4B). The third width W3 is defined by the distance between the patterned mask layer 112 and the second sacrificial layer 116 that are located in the transfer structure 100'. The semiconductor structure 100 includes a linear structure 130 formed in the trench 125.

The linear structures 130 are substantially arranged in parallel. The two linear structures 130 located in the same opening 115 constitute a pair of linear structures 130. As shown in FIG. 9C and FIG. 10C, in one opening 115, the positions of the linear structures 130 correspond to the positions of the first trench 125a and the second trench 125b, respectively. Therefore, the two linear structures 130 corresponding to the first trench 125a and the second trench 125b may be referred to as "the first linear structure" and "the second linear structure", respectively. In one linear structure 130, the two end portions extend in the same direction. In the same side (for example, the lower side of FIG. 10C), the two end portions of two adjacent linear structures 130 extend in opposite directions. In the same pair of linear structures 130, there is a first space S1 between the end portions of the two linear structures 130, there is a second space S2 between the center portions of the two linear structures 130, and the second space S2 is greater than the first space S1. In the different pairs of linear structures 130, there is a third space S3 between the end portions of the adjacent linear structures 130, there is a fourth space S4 between the center portions of the adjacent linear structures 130, and the fourth space S4 is smaller than the third space S3. Since the thickness of the third sacrificial layer 118 gradually decreases from the extension portion 115b to the main body portion 115a, in the same linear structure 130, each of both end portions has a tapered width.

If the linear structures 130 are conductive lines, in order to avoid a short-circuit occurring between the linear structures 130, the ratio S1/S2 of the first space S1 to the second space S2 may be adjusted to a specific range. Referring to FIG. 10C, the ratio S1/S2 of the first space S1 to the second space S2 is 0.40-0.98.

The first space S1 may be adjusted by controlling the loading effect of the second etch-back process and the third etch-back process. More specifically, in the second etch-back process, the ratio R1/R2 of the etching rate R1 of the first sacrificial layer 114 located in the extension portions 115b to the etching rate R2 of the first sacrificial layer 114 located in the main body portion 115a is 1.5-5.0.

In addition to the ratio W1/W3 of the first width W1 to the third width W3, it is also possible to adjust the difference between the etching rate R1 of the first sacrificial layer 114 located in the extension portions 115b and the etching rate R2 of the first sacrificial layer 114 located in the main body portion 115a by controlling the etching parameters (for example, etching gas, etching time, and so on) of the second etch-back process. During the second etch-back process, if the difference between the etching rate R1 of the first sacrificial layer 114 located in the extension portions 115b and the etching rate R2 of the first sacrificial layer 114 located in the main body portion 115a is increased, the first space S1 is reduced.

On the other hand, during the third etch-back process, the ratio R3/R4 of the etching rate R3 of the third sacrificial layer 118 located in the main body portion 115a to the etching rate R4 of the third sacrificial layer 118 located in the extension portions 115b is 1.5-2.0. In addition to the ratio W1/W3 of the first width W1 to the third width W3, it is also possible to adjust the difference between the etching rate R3 of the third sacrificial layer 118 located in the main body portion 115a and the etching rate R4 of the third sacrificial layer 118 located in the extension portions 115b by controlling the etching parameters (for example, the composition of the etching solution, the concentration of the etching solution, the temperature of the etching solution, etching time, and so on) of the third etch-back process. During the third etch-back process, if the difference between the etching rate R3 of the third sacrificial layer 118 located in the main body portion 115a and the etching rate R4 of the third sacrificial layer 118 located in the extension portions 115b is increased, the first space S1 is increased.

In the situation where the linear structure 130 is a conductive line, if the first space S1 is sufficiently large (for example, the ratio S1/S2 of the first space S1 to the second space S2 is equal to or greater than 0.70), the short-circuit between the linear structures 130 may be avoided. As a result, the yield and reliability may be further improved.

Figure 11:
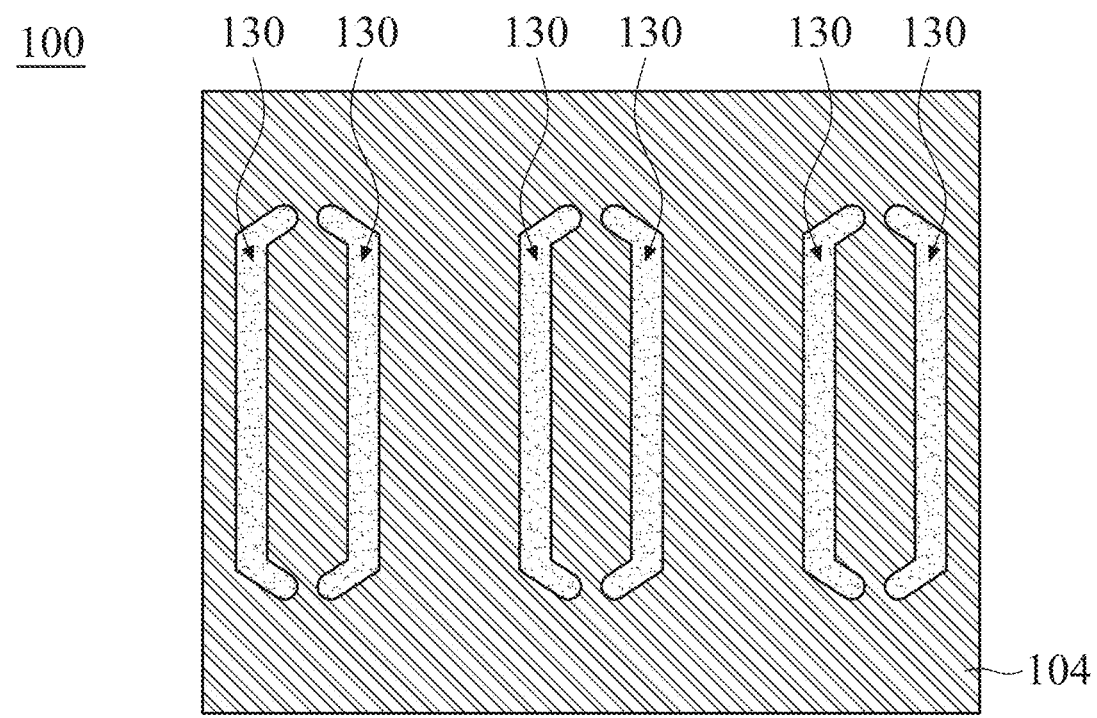
FIG. 11 is a top-view of the semiconductor structure in accordance with other embodiments of the present invention.

FIG. 11 is a top-view of the semiconductor structure in accordance with other embodiments of the present invention. The linear structure 130 shown in FIG. 11 is similar to the linear structure 130 shown in FIG. 10C, and the difference is that the linear structure 130 shown in FIG. 11 has a different shape of the end portion. In the present embodiment, both end portions of the linear structure 130 have a smooth curved shape, which can avoid electrical interference or short-circuit occurring between the end portions of the adjacent linear structure 130.

In summary, in the manufacturing method of the semiconductor structure provided by the embodiments of the present invention, a plurality of parallel trenches can be formed in a self-alignment manner by designing the pattern of the openings of the patterned mask layer of the transfer structure. Therefore, the yield and reliability of the semiconductor structure can be significantly improved. Furthermore, the shape and the space of the end portions of the linear structures can be adjusted by controlling the loading effect during etching of the sacrificial layer. As a result, the yield and reliability of the semiconductor structure can be further improved. In addition, only one photomask is used, and no end cut step is required. Furthermore, such manufacturing methods can be easily integrated into existing manufacturing processes. Therefore, the production cost and the complexity of the manufacturing process can be significantly reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a substrate;
an insulating layer formed on the substrate; and
a plurality of pairs of linear structures arranged in parallel and filled in the insulating layer, wherein each pair of linear structures has a first linear structure and a second linear structure,
wherein in each pair of linear structures, the insulating layer has a first width between an end of the first linear structure and an end of the second linear structure, each end being a point of the respective linear structure farthest from a center portion of the linear structure, and the insulating layer has a second width between center portions of the first linear structure and the second linear structure, the second width being greater than the first width.

2. The semiconductor structure as claimed in claim 1, wherein a ratio of the first width to the second width is 0.40-0.98.

3. The semiconductor structure as claimed in claim 1, wherein an end portion of the first linear structure has a tapered width.

4. The semiconductor structure as claimed in claim 1, wherein an end portion of the first linear structure has a smooth curved shape.

5. The semiconductor structure as claimed in claim 1, wherein the first linear structure is a conductive line or an isolation structure.

6. The semiconductor structure as claimed in claim 1, wherein between two adjacent pairs of linear structures, the two linear structures respectively positioned on the mutually facing sides of the two adjacent pairs have end portions extending away from each other.

7. The semiconductor structure as claimed in claim 1, wherein the center portion of the first linear structure is parallel to the center portion of the second linear structure, and an end portion of the first linear structure is not parallel to an end portion of the second linear structure.

8. The semiconductor structure as claimed in claim 1, wherein an end portion of the first linear structure is neither parallel nor perpendicular to the center portion of the first linear structure.

9. The semiconductor structure as claimed in claim 1, wherein an end portion of the second linear structure is neither parallel nor perpendicular to the center portion of the second linear structure.

10. The semiconductor structure as claimed in claim 1, wherein an end portion of the first linear structure extends in a first extension direction, an end portion of the second linear structure extends in a second extension direction, and the first extension direction is different from the second extension direction.

11. The semiconductor structure as claimed in claim 1, wherein the first linear structure further comprises a first end portion and a second end portion, and the center portion of the first linear structure is between the first end portion of the first linear structure and the second end portion of the first linear structure.

12. The semiconductor structure as claimed in claim 11, wherein the second linear structure further comprises a first end portion and a second end portion, and the center portion of the second linear structure is between the first end portion of the second linear structure and the second end portion of the second linear structure,
wherein the first end portion of the first linear structure is adjacent to the first end portion of the second linear structure, and the second end portion of the first linear structure is adjacent to the second end portion of the second linear structure.

13. The semiconductor structure as claimed in claim 12, wherein the first end portion of the first linear structure extends from the center portion of the first linear structure toward the first end portion of the second linear structure.

14. The semiconductor structure as claimed in claim 13, wherein the second end portion of the first linear structure extends from the center portion of the first linear structure toward the second end portion of the first linear structure.

15. The semiconductor structure as claimed in claim 14, wherein the first end portion of the second linear structure extends from the center portion of the second linear structure toward the first end portion of the first linear structure.

16. The semiconductor structure as claimed in claim 15, wherein the second end portion of the second linear structure extends from the center portion of the second linear structure toward the second end portion of the first linear structure.

* * * * *